United States Patent
Liebmann et al.

(10) Patent No.: US 11,335,599 B2
(45) Date of Patent: May 17, 2022

(54) SELF-ALIGNED CONTACTS FOR 3D LOGIC AND MEMORY

(71) Applicant: Tokyo Electron Limited, Tokyo (JP)

(72) Inventors: Lars Liebmann, Mechanicville, NY (US); Jeffrey Smith, Clifton Park, NY (US); Anton J. deVilliers, Clifton Park, NY (US); Kandabara Tapily, Mechanicville, NY (US)

(73) Assignee: Tokyo Electron Limited, Tokyo (JP)

( * ) Notice: Subject to any disclaimer, the term of this patent is extended or adjusted under 35 U.S.C. 154(b) by 210 days.

(21) Appl. No.: 16/721,583

(22) Filed: Dec. 19, 2019

(65) Prior Publication Data

US 2020/0373203 A1    Nov. 26, 2020

Related U.S. Application Data

(60) Provisional application No. 62/852,434, filed on May 24, 2019.

(51) Int. Cl.
*H01L 21/768* (2006.01)
*H01L 23/522* (2006.01)
(Continued)

(52) U.S. Cl.
CPC .... *H01L 21/76897* (2013.01); *H01L 21/8221* (2013.01); *H01L 21/823871* (2013.01);
(Continued)

(58) Field of Classification Search
CPC ........... H01L 21/76897; H01L 23/5226; H01L 27/11807; H01L 21/823871;
(Continued)

(56) References Cited

U.S. PATENT DOCUMENTS

2014/0043911 A1    2/2014   Samachisa et al.
2015/0054046 A1    2/2015   Higashitani et al.
(Continued)

FOREIGN PATENT DOCUMENTS

KR   10-2012-0053329 A    5/2012
WO   WO 2018/237106 A1    12/2018

OTHER PUBLICATIONS

International Search Report and Written Opinion dated Jul. 28, 2020 in PCT/US2020/026672, citing documents AA through AC, AO and AP therein, 9 pages.

*Primary Examiner* — Karen Kusumakar
*Assistant Examiner* — Adam S Bowen
(74) *Attorney, Agent, or Firm* — Oblon, McClelland, Maier & Neustadt, L.L.P.

(57) ABSTRACT

A semiconductor device includes dielectric layers and local interconnects that are stacked over a substrate alternatively, and extend along a top surface of the substrate laterally. Sidewalls of the dielectric layers and sidewalls of the local interconnects have a staircase configuration. The local interconnects are spaced apart from each other by dielectric layers and have uncovered portions by the dielectric layers. The semiconductor device also includes conductive layers selectively positioned over the uncovered portions of the local interconnects, where sidewalls of the conductive layers and sidewalls of the local interconnects are coplanar. The semiconductor device further includes isolation caps that extend from the dielectric layers. The isolation caps are positioned along sidewalls of the conductive layers and sidewalls of the local interconnects so as to separate the conductive layers from one another.

20 Claims, 18 Drawing Sheets

(51) Int. Cl.
*H01L 27/118* (2006.01)
*H01L 21/8238* (2006.01)
*H01L 21/822* (2006.01)
*H01L 27/11* (2006.01)

(52) U.S. Cl.
CPC .. *H01L 21/823878* (2013.01); *H01L 23/5226* (2013.01); *H01L 27/11807* (2013.01); *H01L 27/1104* (2013.01); *H01L 2027/11864* (2013.01)

(58) Field of Classification Search
CPC ......... H01L 21/823878; H01L 21/8221; H01L 2027/11864; H01L 21/76816; H01L 21/76801; H01L 21/76879; H01L 21/76895; H01L 27/092; H01L 27/0688; H01L 27/11575; H01L 27/11548
See application file for complete search history.

(56) References Cited

U.S. PATENT DOCUMENTS

| | | |
|---|---|---|
| 2018/0026042 A1 | 1/2018 | Smith et al. |
| 2020/0111798 A1* | 4/2020 | Paul ................. H01L 21/76805 |
| 2020/0235121 A1* | 7/2020 | Liu .................. H01L 27/11519 |

* cited by examiner

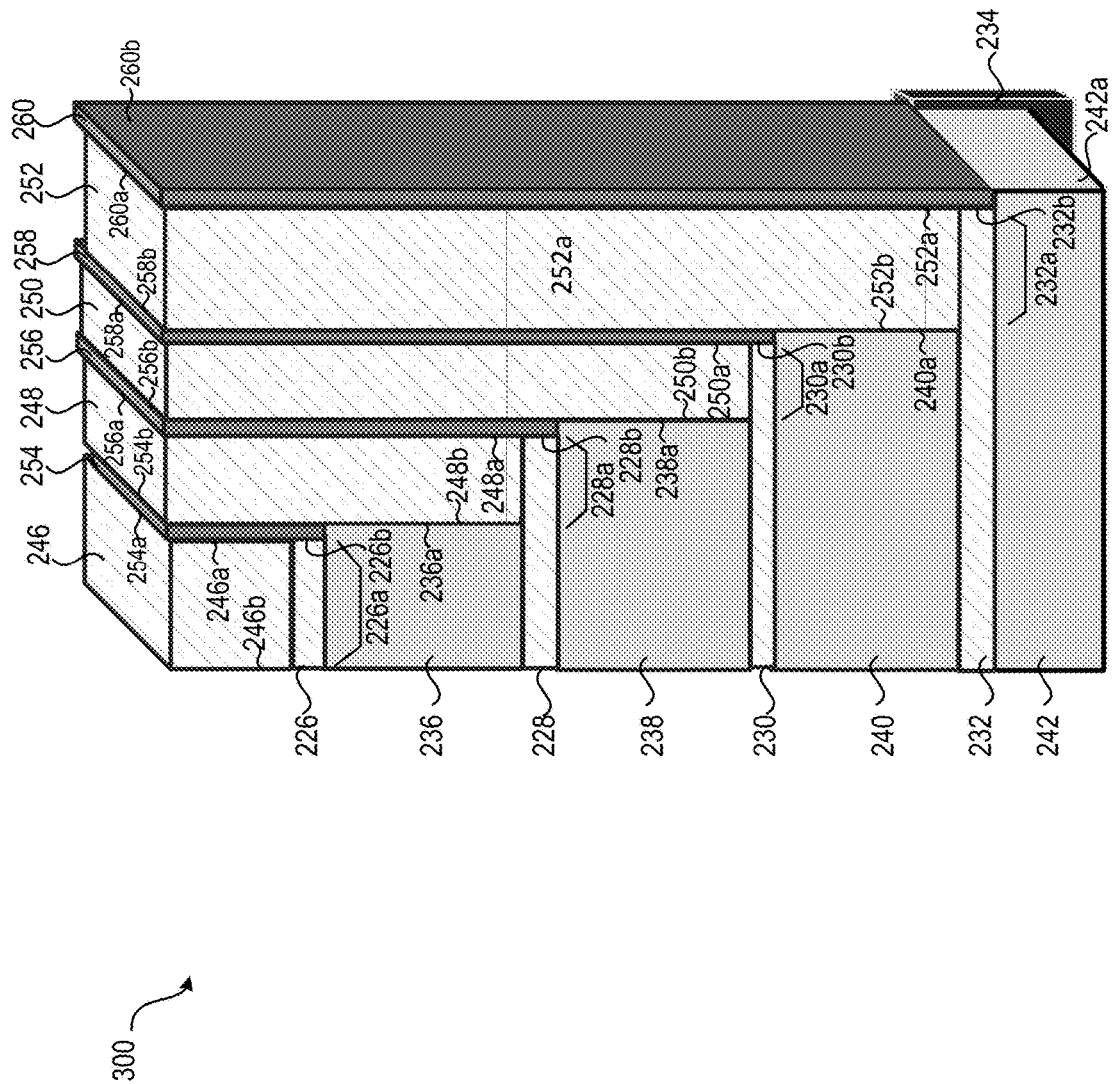

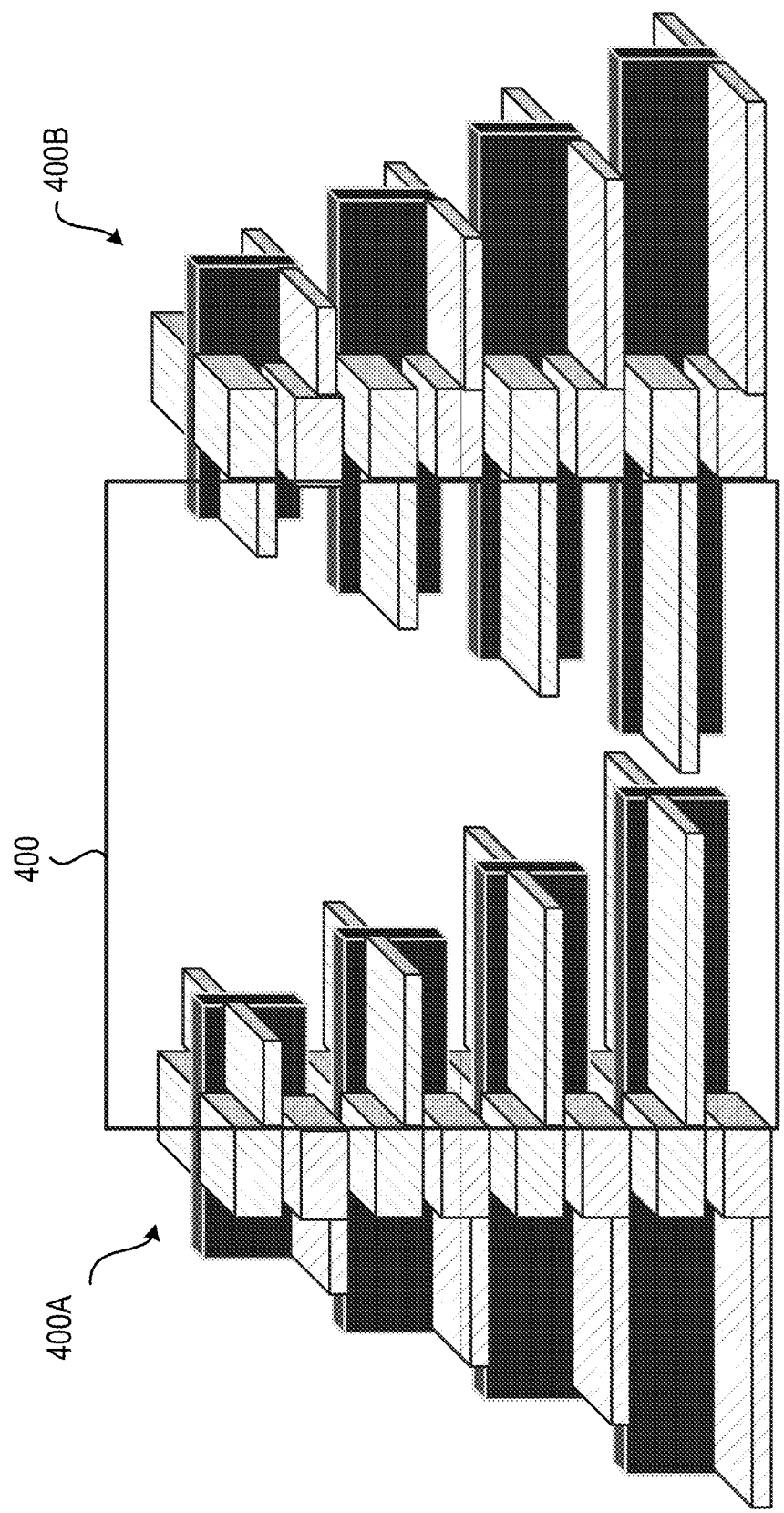

SELF-ALIGNED CONTACTS FOR 3D LOGIC AND MEMORY

CROSS REFERENCE TO RELATED APPLICATIONS

This application claims the benefit of U.S. Provisional Application No. 62/852,434 filed on May 24, 2019, the entire contents of which is incorporated herein by reference.

FIELD OF THE INVENTION

This disclosure relates to methods of microfabrication, including fabrication of semiconductor devices.

BACKGROUND

In the manufacture of a semiconductor device (especially on the microscopic scale), various fabrication processes are executed such as film-forming depositions, etch mask creation, patterning, material etching and removal, and doping treatments. These processes are performed repeatedly to form desired semiconductor device elements on a substrate. Historically, with microfabrication, transistors have been created in one plane, with wiring/metallization formed above the active device plane, and have thus been characterized as two-dimensional (2D) circuits or 2D fabrication. Scaling efforts have greatly increased the number of transistors per unit area in 2D circuits, yet scaling efforts are running into greater challenges as scaling enters single digit nanometer semiconductor device fabrication nodes. Semiconductor device fabricators have expressed a desire for three-dimensional (3D) semiconductor circuits in which transistors are stacked on top of each other.

SUMMARY 3D integration has been seen as the most viable option to continue semiconductor scaling in spite of inevitable saturation in critical dimension scaling. As a contacted gate pitch reaches its scaling limit due to manufacturing variability and electrostatic device limitations, two-dimensional transistor density scaling stops. Even experimental new transistor designs, such as vertical channel gate-all-around transistors, that may be able to one day overcome these contacted gate pitch scaling limits, do not promise to get semiconductor scaling back on track because resistance, capacitance, and reliability concerns prevent wire pitch scaling, thereby limiting the density with which transistors can be wired into circuits.

3D integration, i.e., the vertical stacking of multiple devices, aims to overcome these scaling limitations by increasing transistor density in volume rather than area. This idea has been successfully demonstrated and implemented by the flash memory industry with the adoption of 3D NAND. 3D integration of logic devices, however, has considerable challenges. One challenge to achieve scaling density in 3D integrated devices is a minimum pitch with which subsequent device levels can be contacted from the wiring levels above.

Techniques herein provide a self-aligned process flow to form contacts on stair-cased devices at dimensions which are decoupled from lithography resolution or overlay control. Accordingly, vertical connections on stair-cased devices in 3D integrated logic or memory are provided using monolithically integrated stacks of transistors.

Of course, an order of the manufacturing steps disclosed herein is presented for clarity sake. In general, these manufacturing steps can be performed in any suitable order. Additionally, although each of the different features, techniques, configurations, etc. herein may be discussed in different places of the present disclosure, it should be noted that each of the concepts can be executed independently from each other or in combination with each other. Accordingly, the present disclosure can be embodied and viewed in many different ways.

It should be noted that this summary section does not specify every embodiment and/or incrementally novel aspect of the present disclosure or claimed invention. Instead, this summary only provides a preliminary discussion of different embodiments and corresponding points of novelty over conventional techniques. For additional details and/or possible perspectives of the invention and embodiments, the reader is directed to the Detailed Description section and corresponding figures of the present disclosure as further discussed below.

According to an aspect of the disclosure, a semiconductor device is provided. The device includes a plurality of dielectric layers that are stacked over a substrate and extend along a top surface of the substrate laterally with a staircase configuration. The device also includes a plurality of local interconnects. The local interconnects are stacked over the dielectric layers alternatively and extend along the top surface of the substrate laterally with a staircase configuration. The local interconnects are spaced apart from each other by the dielectric layers and have uncovered portions by the dielectric layers. The device further includes a plurality of conductive layers selectively positioned over the uncovered portions of the local interconnects, where sidewalls of the conductive layers are level with sidewalls of the local interconnects. The semiconductor device also includes a plurality of isolation caps that extend from the dielectric layers. The isolation caps further are positioned along sidewalls of the conductive layers and the local interconnects so as to separate the conductive layers from one another.

In some embodiments, the device includes a plurality of transistor pairs that are stacked over the substrate, and each of the transistor pairs includes a n-type transistor and a p-type transistor that are stacked over one another. The n-type transistor can have a source region and a drain region that are positioned at two ends of a n-type channel region of the n-type transistor. Each of the source region and drain region of the n-type transistor is coupled to a respective local interconnect, and the n-type channel region is surrounded by a n-type gate structure. The p-type transistor has a source region and a drain region that are positioned at two ends of a p-type channel region of the p-type transistor. Each of the source region and drain region of the p-type transistor is coupled to a respective local interconnect, and the p-type channel region is surrounded by a p-type gate structure.

The semiconductor device can include a plurality of gate electrodes that are stacked over the substrate with a staircase configuration, where each of the gate electrodes is electrically coupled to a corresponding gate structure of the transistor pairs. Further, each of the local interconnects is positioned at one of two sides of a respective gate electrode.

In the semiconductor device, top surfaces of the isolation caps can be level with top surfaces of the conductive layers. In addition, each of the isolation caps has a first sidewall and a second sidewall. The first sidewall of each of the isolation caps is in direct contact with a respective local interconnect, and the second sidewall of each of the isolation caps is level with a sidewall of a respective dielectric layer.

In the semiconductor device, a sidewall of each of the dielectric layers protrudes beyond a sidewall of an overlying local interconnect so as to form a gap, where a corresponding isolation cap is positioned in the gap.

According to another aspect of the disclosure, a method for forming a semiconductor device is provided. In the disclosed method, a plurality of transistor pairs are formed. The transistor pairs are stacked over a substrate, and each of the transistor pairs includes a n-type transistor and a p-type transistor that are stacked over one another. In addition, a plurality of local interconnects are stacked over the substrate with a staircase configuration, electrically coupled to source regions and drain regions of the transistor pairs, and spaced apart from each other by dielectric layers with a staircase configuration. A plurality of isolation caps are subsequently formed. The isolation caps are selectively positioned on sidewalls of the local interconnects and the dielectric layers. Further, portions of the dielectric layers are removed along sidewalls of the isolation caps to uncover portions of the local interconnects. A plurality of conductive layers are subsequently formed over the uncovered portions of the local interconnects so that the conductive layers are spaced apart from one another by the isolation caps.

In some embodiments, before the portions of the dielectric layers are removed, the isolation caps can be selectively grown vertically along the sidewalls of the local interconnects and the dielectric layers.

In some embodiments, the isolation caps and the conductive layers can be alternatively grown so as to reach a predetermined height. When the predetermined height is reached, a surface planarization process can be performed so that top surfaces of the isolation caps are level with top surfaces of the conductive layers.

According to yet another aspect of the disclosure, a semiconductor device is provided. The device includes a plurality of transistor pairs that are stacked over a substrate, where each of the transistor pairs includes a n-type transistor and a p-type transistor that are stacked over one another. The device also includes a plurality of local interconnects that are stacked over the substrate and extend along a top surface of the substrate horizontally with a staircase configuration, where the local interconnects are electrically coupled to source regions and drain regions of the transistor pairs, and spaced apart from each other by dielectric layers. The dielectric layers have a staircase configuration so that the local interconnect have uncovered portions by the dielectric layers. The device also includes a plurality of conductive layers selectively positioned over the uncovered portions of the local interconnects, where sidewalls of the conductive layers are level with sidewalls of the local interconnects. The device further includes a plurality of isolation caps. The isolation caps extend from the dielectric layers, and are positioned along sidewalls of the conductive layers and the local interconnects so as to separate the conductive layers from one another.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 2 is a schematic view of a semiconductor device that is formed based on a 3D integrated CFET stack with self-aligned contacts, in accordance with some embodiments.

FIGS. 3A-3M are schematic views of various exemplary intermediate steps of manufacturing a semiconductor device that is formed based on a 3D integrated CFET stack with self-aligned contacts, in accordance with some embodiments.

DETAILED DESCRIPTION

Figure 1A:
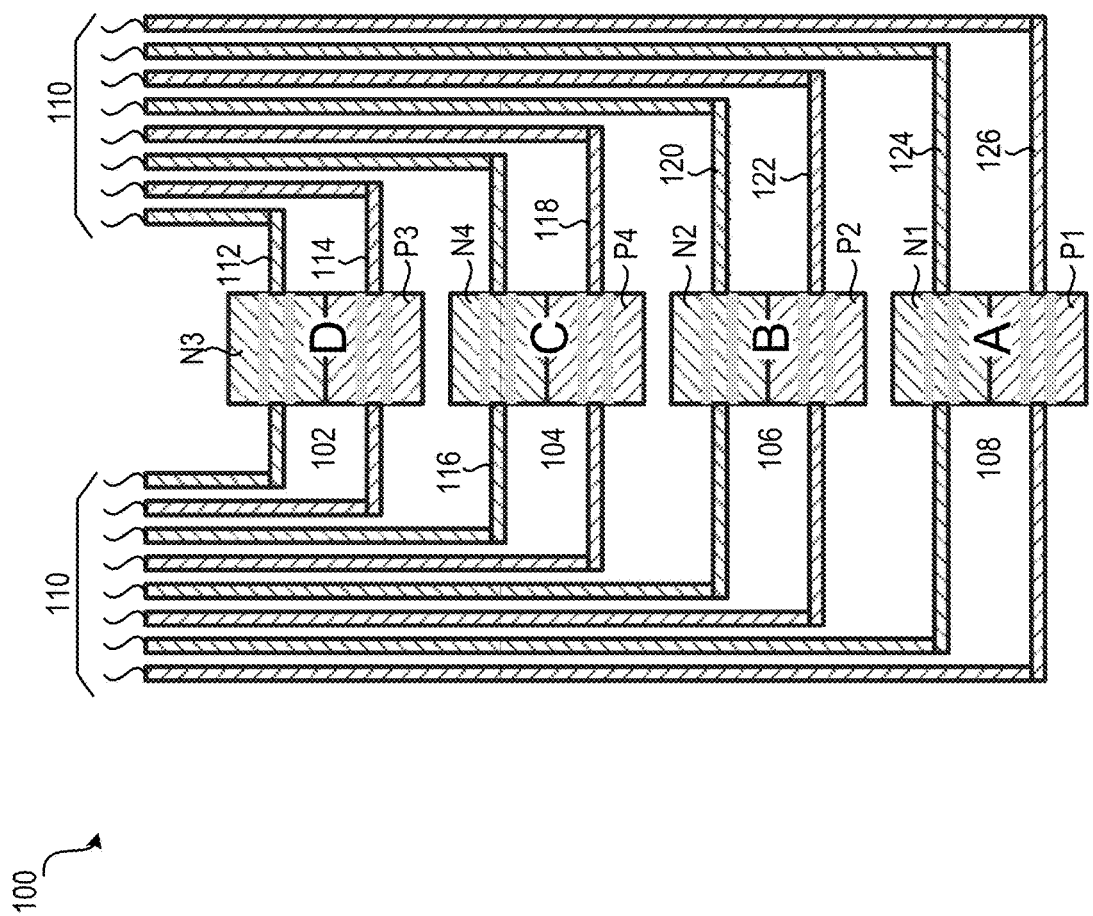
FIG. 1A is a schematic diagram of a semiconductor device that is formed based on a 3D integrated CFET stack with stair-cased local interconnects, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the apparatus in use or operation in addition to the orientation depicted in the figures. The apparatus may be otherwise oriented (rotated 90 degrees or at other orientations) and the spatially relative descriptors used herein may likewise be interpreted accordingly.

Reference throughout the specification to "one embodiment" or "an embodiment" means that a particular feature, structure, material, or characteristic described in connection with the embodiment is included in at least one embodiment, but do not denote that they are present in every embodiment. Thus, the appearances of the phrases "in one embodiment" in various places through the specification are not necessarily referring to the same embodiment. Furthermore, the particular features, structures, materials, or characteristics may be combined in any suitable manner in one or more embodiments.

FIG. 1A is a schematic diagram of a semiconductor device that is formed based on a 3D integrated CFET stack 100 (also referred to as transistor stack 100, or CFET transistor stack 100) with stair-cased local interconnects. The complementary field effect transistor (CFET) devices are three-dimensionally stacked logic standard cells in which either the NMOS or PMOS transistor is positioned overtop (vertically above) its complement. Such a configuration enables an area-scaling and routing congestion improvement for logic standard cells as well as SRAM memory cells. The schematic diagram of the transistor stack 100 illustrates a challenge solved by techniques herein. FIG. 1A illustrates a stair-cased stack of p-type and n-type transistors. Specifically, FIG. 1A shows four complementary transistor pairs stacked in a stair-cased pyramid. The stair-casing enables each device level to be contacted from a particular wiring level above.

As shown in FIG. 1A, the transistor stack 100 with stepped or pyramidal local interconnects has vertical contacts 110 extending from steps of the transistor stack 100. The transistor stack 100 can include four CFET devices 102-108 that are stacked over a substrate (not shown). Each of the CFET devices can include a n-type transistor and p-type transistor that are coupled to a respective input (e.g., inputs A-D). For example, the CFET 102 can include the n-type transistor N3 and a p-type transistor P3. The transistor stack 100 can have a plurality of local interconnects 112-126 that have a staircase configuration. Each of the local interconnects is coupled to a respective transistor. The transistor stack 100 can further include a set of array of vertical contacts 110 that are coupled to and extend from the local interconnects 112-126. The set of array of vertical contacts 110 can have top surfaces in-plane with each other, while length of each vertical contact or column is different depending on a height and location of a landing step.

Figure 1B:
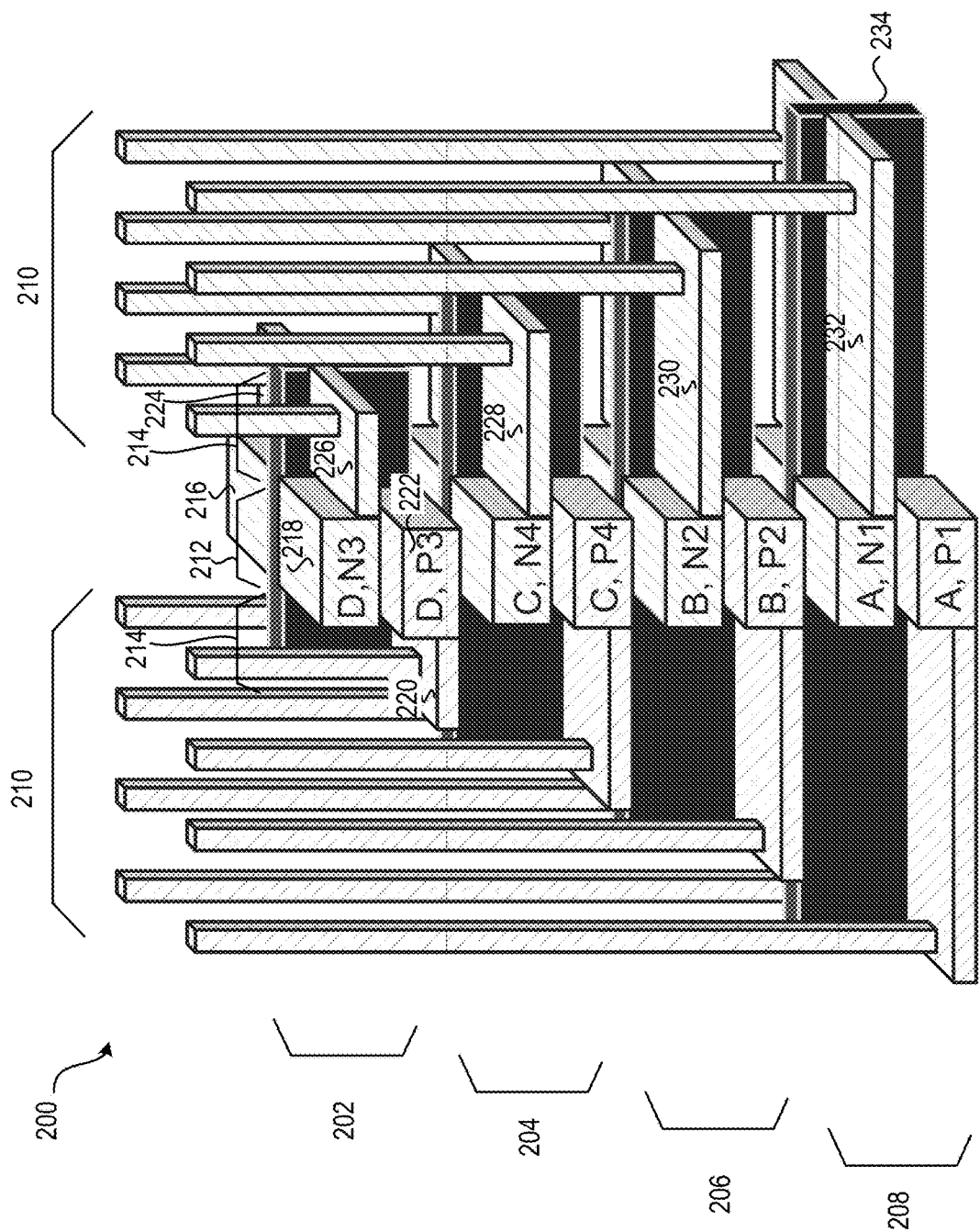
FIG. 1B is a schematic view of a semiconductor device that is formed based on a 3D integrated CFET stack with stair-cased local interconnects, in accordance with some embodiments.

FIG. 1B is an illustration of contacts landing on each of the local interconnects to contact subsequent source/drain regions from a given wiring level above. In other words, FIG. 1B shows an array of contacts landing on the stair-cased device stack. An achievable minimum size of an overall stacked device arrangement is ultimately limited by a required minimum landing area on each device level.

As shown in FIG. 1B, a semiconductor device can be formed based on a 3D integrated CFET stack 200 (also referred to as transistor stack 200 or CFET transistor stack 200) with stair-cased local interconnects. The CFET transistor stack 200 can include four CFET devices 202-208 that are stacked over a substrate (not shown). Each of the four CFET devices can include a transistor pair that is formed by a n-type transistor and a p-type transistor. For example, the CFET device 202 can include a transistor pair that is formed by the n-type transistor N3 and the p-type transistor P3. The n-type transistor can be positioned over the p-type transistor. In some embodiments, the n-type transistor and the p-type transistor can have a shared gate structure. The gate structure can surround a n-type channel region of the n-type transistor and a p-type channel region of the p-type transistor. The channel region can have a sheet, wire or bar configuration. The n-type transistor can have a source region and a drain region that are positioned at two ends of the n-type channel region respectively, where the gate structure surrounds the n-type channel region, and positioned between the source region and the drain region of the n-type transistor. The p-type transistor can have a source region and a drain region that are positioned at two ends of the p-type channel region respectively, where the gate structure surrounds the p-type channel region, and positioned between the source region and the drain region of the p-type transistor. Moreover, the gate structure can be electrically coupled to a gate electrode. The source region and the drain region can have a source local interconnect and a drain local interconnect respectively.

For example, the n-type transistor N3 and the p-type transistor P3 have a shared gate structure 212. The n-type transistor N3 has a source region 218 and a drain region 216 that are positioned at two ends of the n-type channel region. The n-channel region is surrounded by the gate structure 212, where the gate structure 212 is positioned between the source region 218 and the drain region 216. The p-type transistor P3 has a source region 222 and a drain region behind the gate structure 212. The source region 222 and the drain region are positioned at two ends of the p-type channel region. Similarly, the p-type channel region is surrounded by the gate structure 212, where the gate structure 212 is positioned between the source region 222 and the drain region of the p-type transistor P3.

The gate structure 212 can have one or more gate electrodes 214. The gate electrodes 214 can be positioned at two ends of the gate structure 212. The source region 218 and the drain region 216 of the n-type transistor N3 can have a source local interconnect 226 and a drain local interconnect 224 respectively. Similarly, the source region 222 of the p-type transistor P3 can have a source local interconnect 220, and the drain region of the p-type transistor P3 can have a drain local interconnect positioned behind the gate structure 212. FIG. 1B also illustrates a plurality of local interconnects 228-232 that are coupled to n-type transistors N4, N2, N1 respectively.

It should be noted that the transistor stack 200 can further include a plurality of dielectric layers (not shown in FIG. 1B) that separate the transistor pairs from one another. The dielectric layers can also separate a n-type transistor and a p-type transistor from one another in a transistor pair. The dielectric layers can further separates the local interconnects (e.g., 220, 224-232 in FIG. 1B) from one another.

In the transistor stack 200, the gate electrodes and the source/drain (S/D) local interconnects can have a staircase configuration. Further, a plurality of vertical contacts 210 are coupled to and extend from the S/D local interconnects or the gate electrodes. Therefore, the staircase configuration of the gate electrodes and the S/D local interconnects provides an easy access to each transistor in the transistor stack 200, and avoids a complicated interconnect connection.

Although FIGS. 1A and 1B provides configurations enabling an area-scaling and routing congestion improvement for logic standard cells as well as SRAM memory cells, an achievable minimum size of an overall stacked device arrangement is ultimately limited by a required minimum landing area on each device level. The minimum landing area of the local interconnects illustrated in FIGS. 1A and 1B driven primarily by two process constraints: lithographic resolution limit and lithographic placement limit. The lithographic resolution refers to a smallest pitch that can be patterned. Specifically, the lithographic resolution is the smallest pitch on which the contact array (e.g., 210 in FIG. 1B) can land, or each contact within the array can land. The smallest pitch is typically limited by resolution limits of a given photolithographic system (e.g., scanner or stepper) that is used to expose a pattern. The lithographic placement limit refers to additional space or tolerance needed to compensate for pattern placement errors. A misplaced pattern can cause shorting of contacts to local interconnect structures belonging to devices on adjacent device levels. In other words, despite capability of printing a small pattern, the pattern itself can be misaligned from a combination of tool and wafer factors.

To achieve higher levels of device integration, it is desirable to minimize the size of each device level's staircase extension by decoupling the size of each step's landing from lithographic resolution and pattern placement constraints. Accordingly, techniques herein provide a self-aligned process for contact placement. An exemplary structure is illustrated in FIG. 2, and an exemplary process flow is illustrated in FIGS. 3A-3M.

FIG. 2 shows a schematic view of a semiconductor device that is formed based on a 3D integrated CFET stack 300 (also referred to as transistor stack 300) with self-aligned contacts (or self-aligned vertical contacts) coupled to the local interconnects. Comparing the transistor stack 300 and the transistor stack 200 of FIG. 1B, the stack 300 can have a plurality of self-aligned vertical contacts (or conductive layers) 246-252 rather than the plurality of vertical contacts 210 positioned over the local interconnects (e.g., 226-232). As shown in FIG. 2, a plurality of dielectric layers 236-242 are stacked over a substrate and extend along a top surface of the substrate (not shown) laterally, where sidewalls 236a-242a of the plurality of dielectric layers 236-242 can have a staircase configuration. The local interconnects 226-232 are stacked over the dielectric layers 236-242 alternately and extend along the top surface of the substrate laterally, where sidewalls 226b-232b of the plurality of local interconnects 226-232 can have a staircase configuration. The local interconnects 226-232 are spaced apart from each other by the dielectric layers 236-242 and have uncovered portions 226a-232a by the dielectric layers 236-242.

Still referring to FIG. 2, a plurality of conductive layers (or self-aligned vertical contacts) 246-252 are selectively positioned over the uncovered portions 226a-232a of the local interconnects 226-232. In some embodiments, first sidewalls 246a-252a of the conductive layers 246-252 are level with the sidewalls 226b-232b of the local interconnects 226-232. For example, a first sidewall 246a of the conductive layer 246 and a sidewall 226b of the local interconnect 226 are coplanar. In some embodiments, second sidewalls 246b-252b of the conductive layers 246-252 can be in direct contact with the dielectric layers or the source/drain regions. For example, a second sidewall 246b of the conductive layer 246 can be in direct contact with the source region 218 (not shown in FIG. 2), and a second sidewall 248b of the conductive layer 248 can be in direct contact with the dielectric layer 236.

The transistor stack 300 can include a plurality of isolation caps 254-260 extending from the dielectric layers 236-242 respectively. The isolation caps 254-260 further are positioned along first sidewalls 246a-252a of the conductive layers 246-252 and the sidewalls 226b-232b of the local interconnects 226-232 so as to separate the conductive layers 246-252 from one another. Still referring to FIG. 2, each of the plurality of isolation caps can have a first sidewall and a second sidewall. The first sidewall of each of isolation caps is in direct contact with a respective local interconnect, and the second sidewall of each of the isolation caps is level with a sidewall of a respective dielectric layer. For example, the isolation caps 254-260 can have first sidewalls 254a-260a, and second sidewalls 254b-260b. The first sidewall 254a of the isolation cap 254 is in direct contact with the local interconnect 226, and the second sidewall 254b of the isolation cap 254 is level with the sidewall 236a of the dielectric layer 236.

In some embodiments, top surfaces of the plurality of isolation caps 254-260 are level with top surfaces of the plurality of conductive layers 246-252.

It should be noted that FIG. 2 is merely an example. The transistor stack 300 can include any number of local interconnects, dielectric layers, and insulation caps.

FIGS. 3A-3M are schematic views of various exemplary intermediate steps of manufacturing a semiconductor device that is formed based on the 3D integrated CFET stack 300 with self-aligned contacts, in accordance with some embodiments.

FIG. 3A illustrates two sets of stacked devices 400A-400B with four complementary transistor pairs each. The example structure shown in FIG. 3A is simplified for convenience in describing embodiments, and can have similar configurations to the 3D integrated CFET stack 200 shown in FIG. 1B except that the contacts (i.e., 210) coupled to the local interconnects are not formed. As mentioned above, logic or memory devices of an integrated circuit can be designed with many rows and columns of these stair-cased device stacks. Note also that the geometry illustrated is non-limiting and that stair-casing of structures can also be accomplished with L-shaped and overlapping structures, or other routing geometries. The stacked device 400A-400B can be formed based on a number of manufacturing processes that can include a film deposition (e.g., CVD, PVD, diffusion, ALD), an etching process, a photolithography process, an ion implantation process, a wet clean process, a surface planarization process (e.g., CMP), a metrology process, or the like.

Figure 3B:
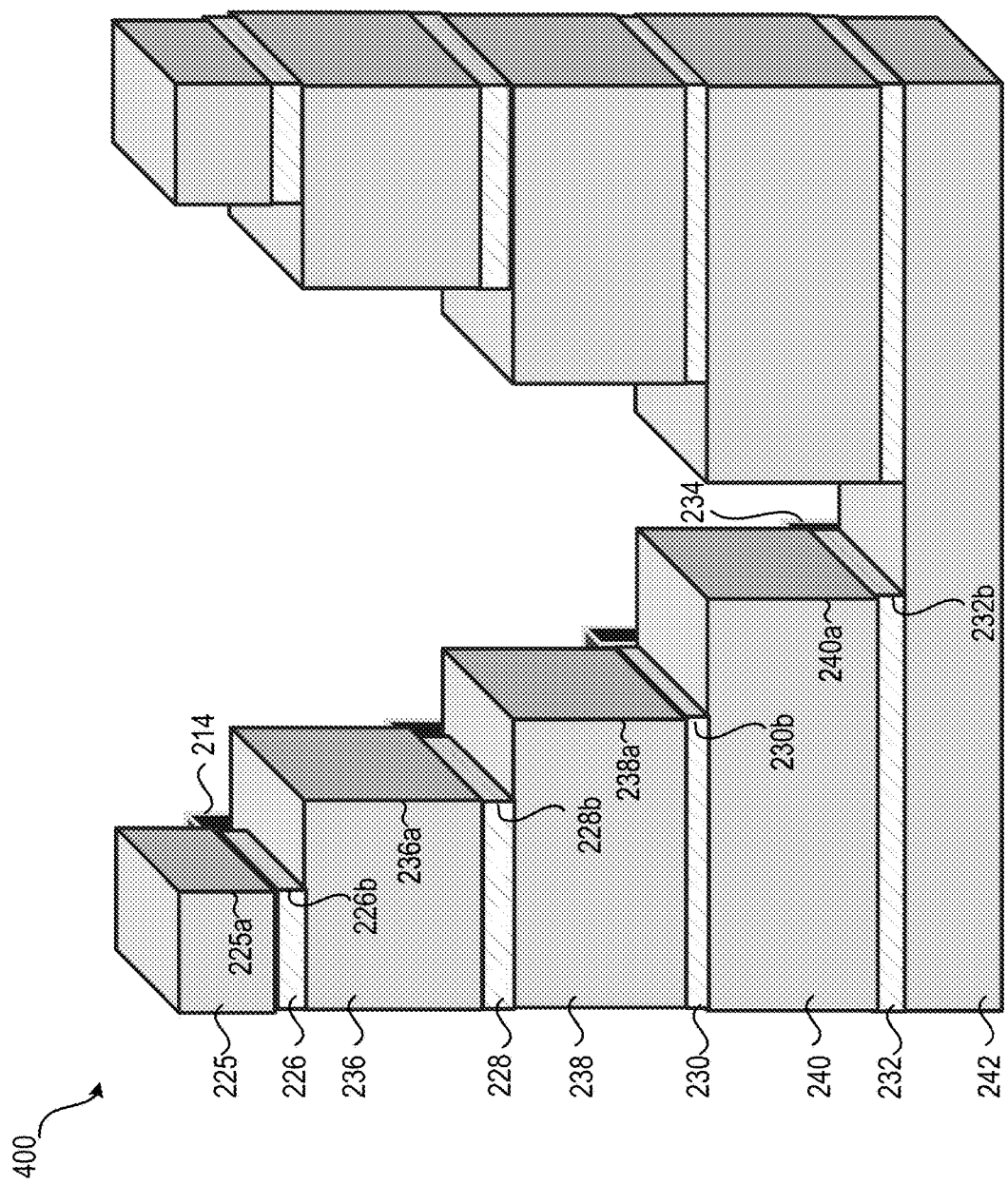

To provide electrical isolation between each device level or layer, a dielectric film (or dielectric layer, insulator, isolation layer), such as the dielectric layer 242, is deposited in-between device levels as shown in FIG. 3A. Both the conductive layer (metal) and the isolation layer (insulator) are deposited as continuous films while a given device stack is being built up prior to the sequence of vertical and lateral etch operations that forms a stair-case. For simplicity and clarity, the dielectric film is not shown in FIG. 3A, and is provided in FIGS. 3B-3M.

FIG. 3B illustrates a close-up view (or expanded view) of a space 400 between the two sets of stair-cased device stacks (also referred to as CFET transistor stacks) 400A-400B with stair-cased configuration. For simplicity and clarity, subsequent manufacturing steps to form the self-aligned contacts (also referred to as self-aligned vertical contacts) are described based on the stair-cased device stack 400A. During formation of the self-aligned contacts in the stair-cased device stack 400A, similar self-aligned contacts can be formed in the stair-cased device stack 400B simultaneously.

As shown in FIG. 3B, the plurality of dielectric layers (or insulators, or isolation layers) 225, and 236-242 and the plurality of local interconnects 226-232 are arranged alternatively so that the local interconnects 226-232 are spaced apart from one another by the dielectric layers 225 and 236-242. In some embodiments, sidewalls 226b-232b of the local interconnects and sidewalls (e.g., 225a, 236a-240a) of the dielectric layers can be coplanar.

Figure 3C:
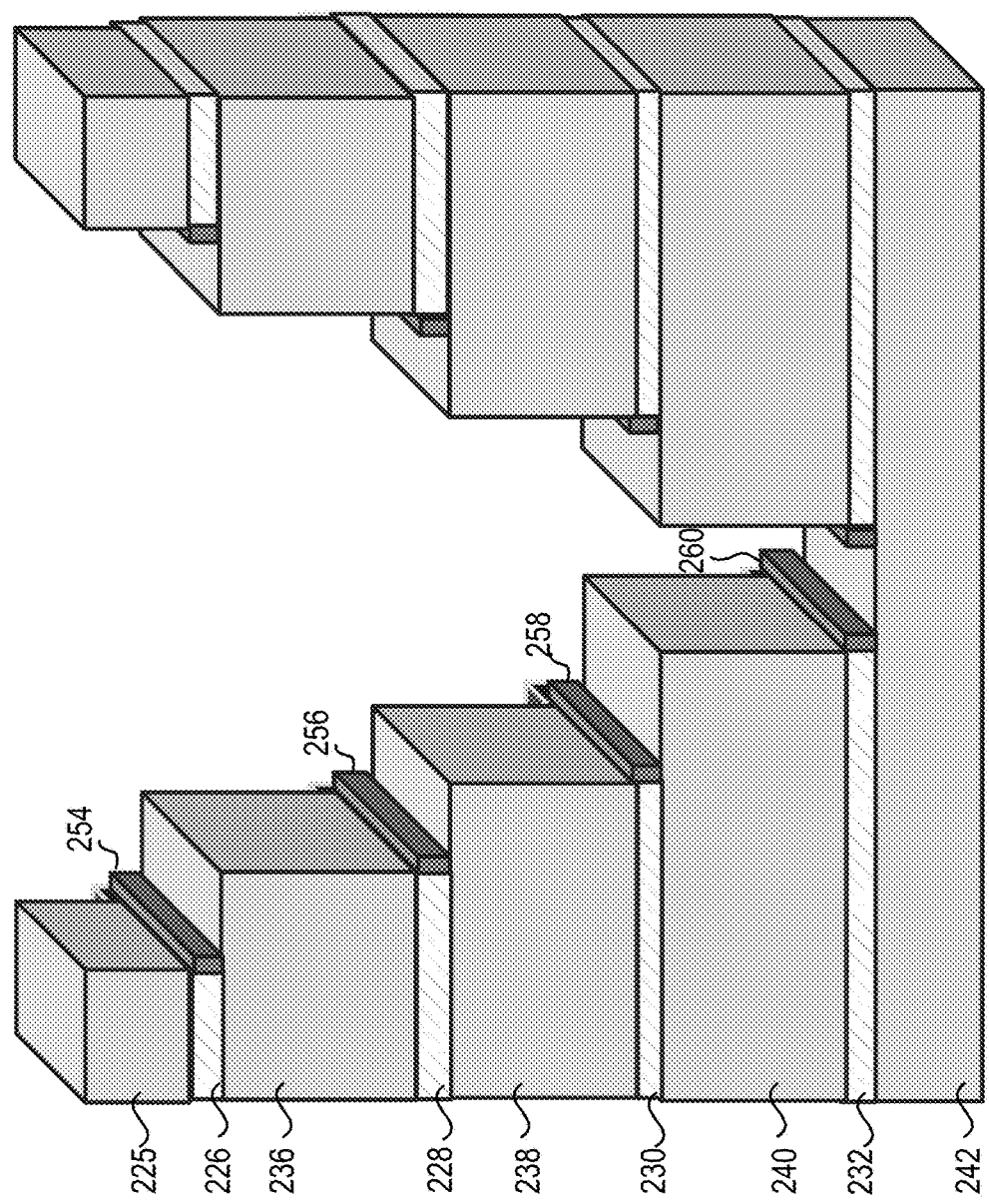

In FIG. 3C, a plurality of electrical isolation caps 254-260 are selectively deposited on ends (or sidewalls) of the local-interconnect structures (or local interconnects) 226-232. Such a selectively-deposited insulation caps herein provides benefits. Using selective deposition on only a material (e.g., tungsten, cobalt, ruthenium) used to form the local interconnect structures, a relatively thin isolation layer is added to the end-face (vertical surface) of each stair or stair step. In other words, an insulation cap is horizontally grown on uncovered sidewalls of local interconnects. This end-face cap insulator (or insulation cap) by itself provides protection against electrical fails of misplaced contacts shorting adjacent levels of local interconnects together. This end-face insulation cap also improves resilience or tolerance to pattern placement errors. The insulation cap can be made of a metal oxide that includes $Al_2O_3$, $HfO_2$, $ZrO_2$, $TiO_2$, or a combination, or other suitable metal oxides. The insulation cap can also be made of a dielectric material, such as SiN, SiO, SiCN, SiCON, SiC, or the like. Any suitable film deposition technique can be applied to form the insulation cap. For example, the film deposition technique can include chemical vapor deposition (CVD), physical vapor deposition (PVD), diffusion, and atomic layer deposition (ALD), or other suitable film deposition processes.

Figure 3D:
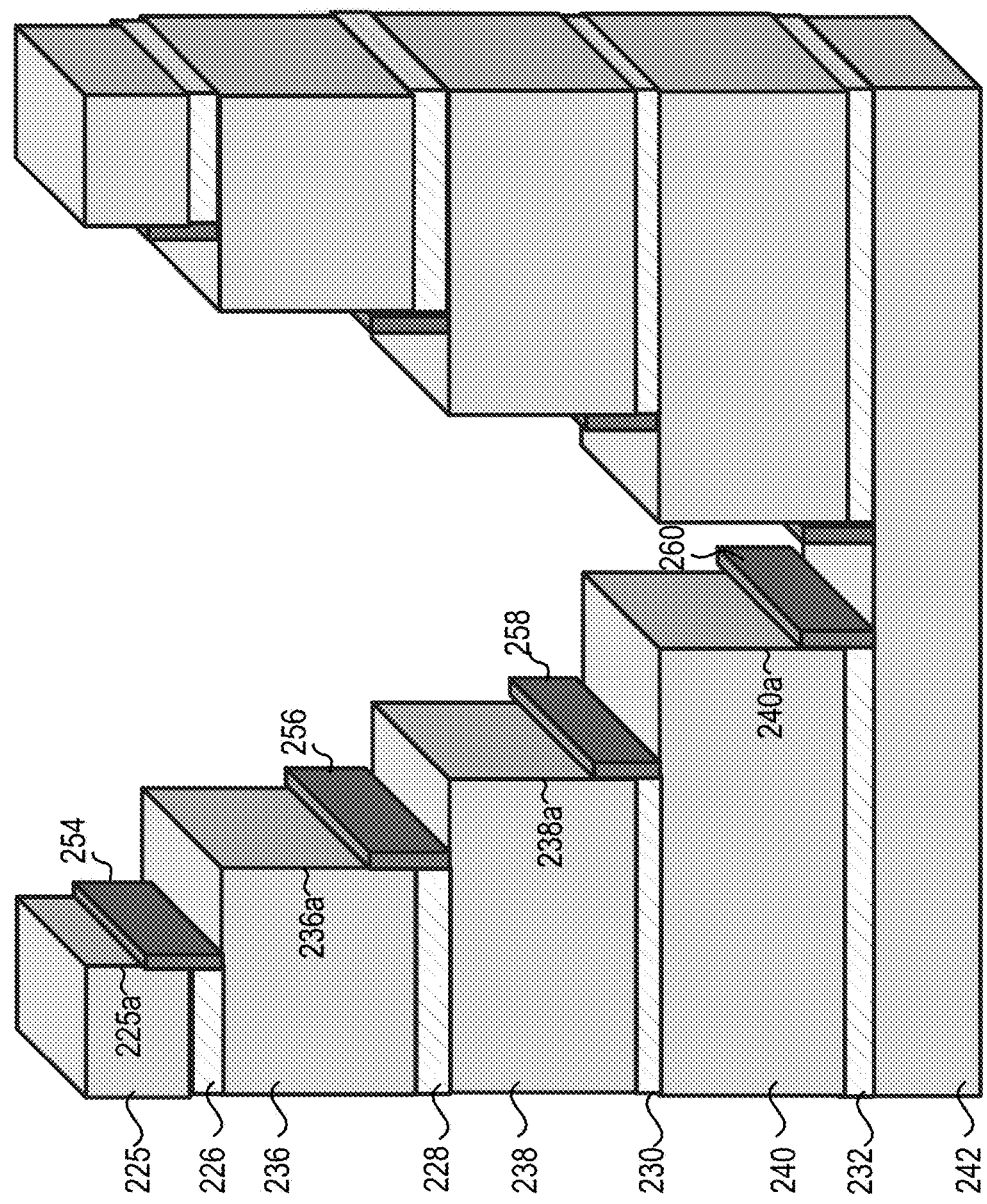

Referring now to FIG. 3D, after formation of the end-face insulation caps (selective deposition of insulator-on-metal), the end-face insulation caps are expanded by selectively depositing insulator-on-insulator. As shown in FIG. 3D, the isolation caps 254-260 are grown along sidewalls of the local interconnects 226-232 and the dielectric layers 225, and 236-242.

Figure 3E:
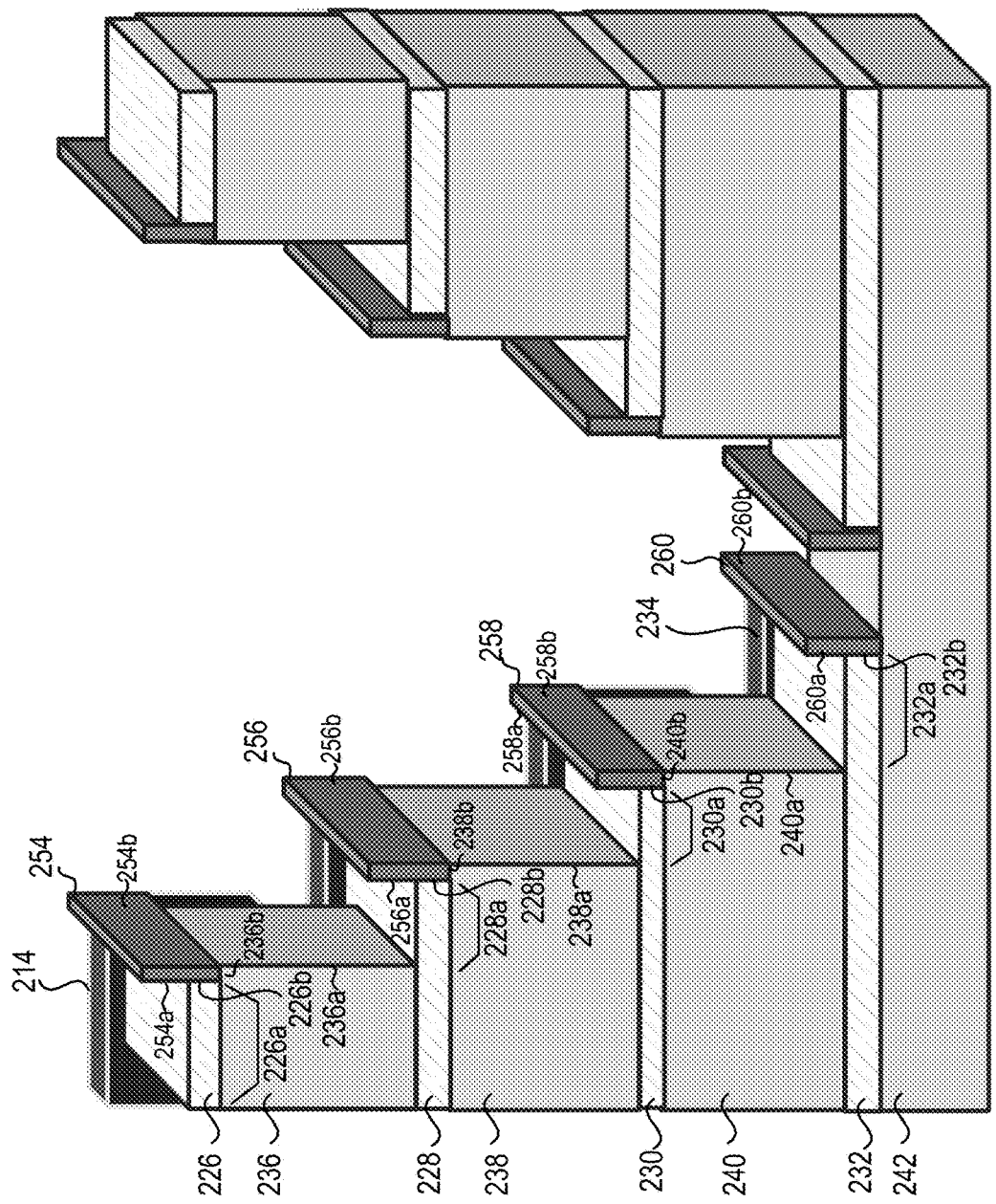

Following the expansion of the insulation caps, the dielectric layer separating the lateral conductive layers (i.e., the local interconnects) is removed by a selective etch to expose the individual conductive metal layers (i.e., the local interconnects) as depicted in FIG. 3E. As shown in FIG. 3E, the selective etch can remove portions of the plurality of dielectric layers along sidewalls (e.g., first sidewalls 254a-260a, and second sidewalls 254b-258b) of the isolation caps 254-260 to uncover portions of the local interconnects 226-232. When the selective etch is completed, a plurality of uncovered portions 226a-232a of the local interconnects are formed. Further, as shown in FIG. 3E, the dielectric layer 225 can be fully removed so that the local interconnect 226 is uncovered fully. In addition, the sidewalls 236a-240a of the dielectric layers 236-240 can be shrunk from the original positions in FIG. 3D due to the selective etch. Accordingly, the second sidewalls 254b-258b of the isolation caps 254-258 can be level with the sidewalls 236a-240a of the dielectric layers 236-240. It should be noted that after the selective etch, the sidewalls 236a-240a of the dielectric layers protrude beyond the sidewalls 226b-232b of the overlying local interconnects 226-232 so as to form a plurality of gaps 236b-240b, and the plurality of isolation caps 254-260 are positioned in the gaps respectively. For example, the sidewall 236a of the dielectric layer 236 extends beyond the sidewall 226b of the overlying local interconnect 226 to form the gap 236b. The isolation cap 254 is positioned in the gap 236b.

Figure 3F:
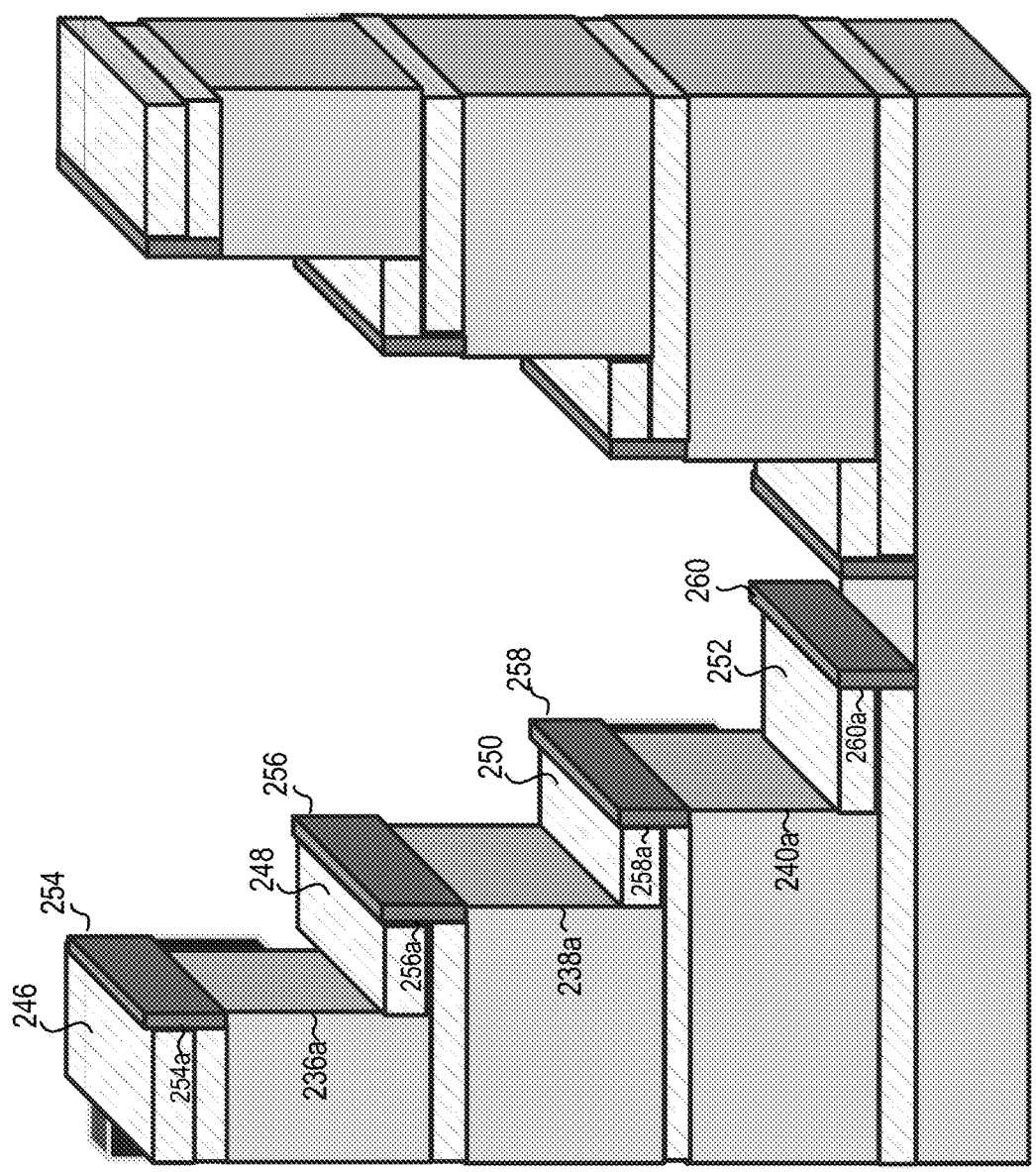
Figure 3G:
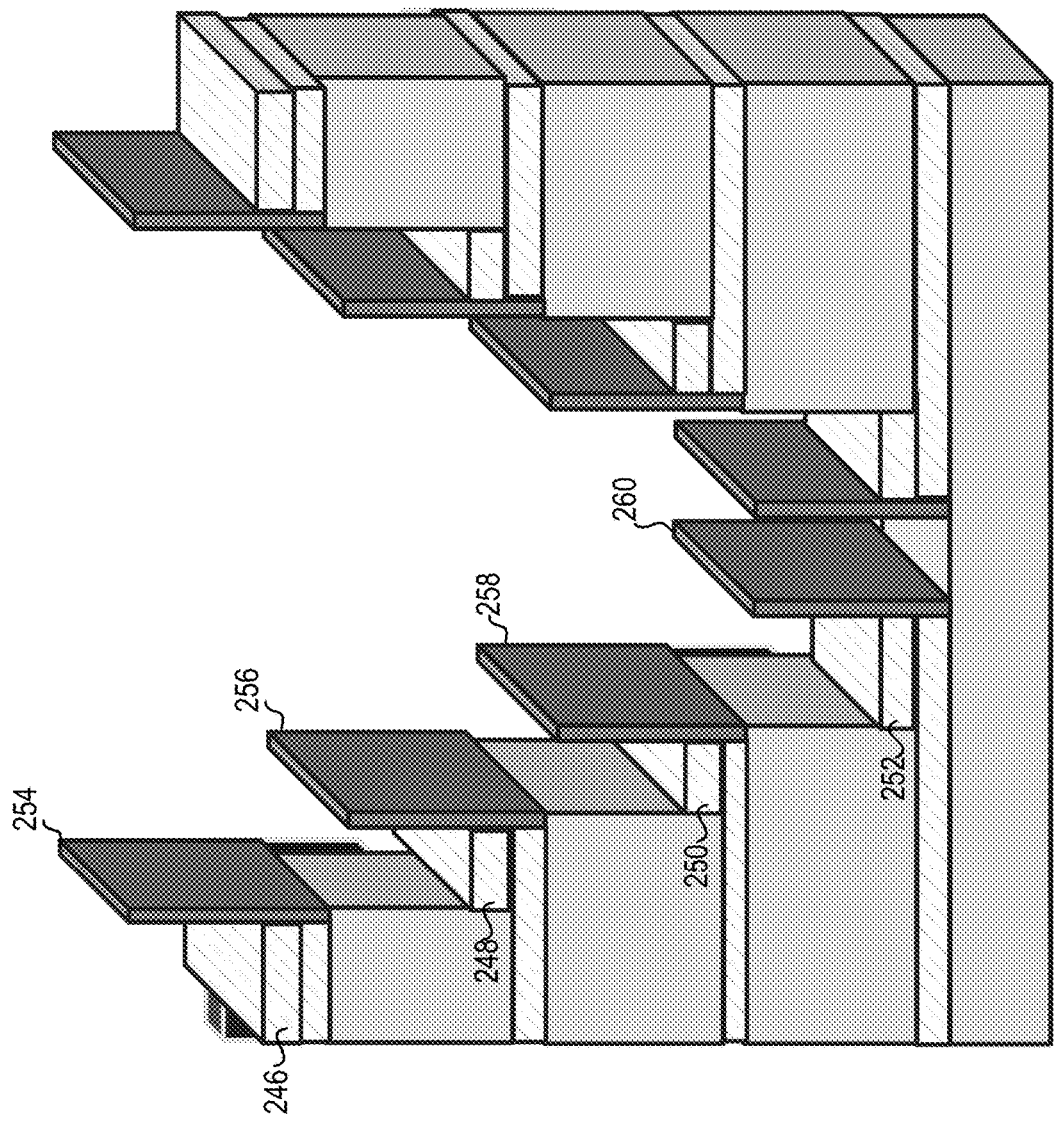
Figure 3H:
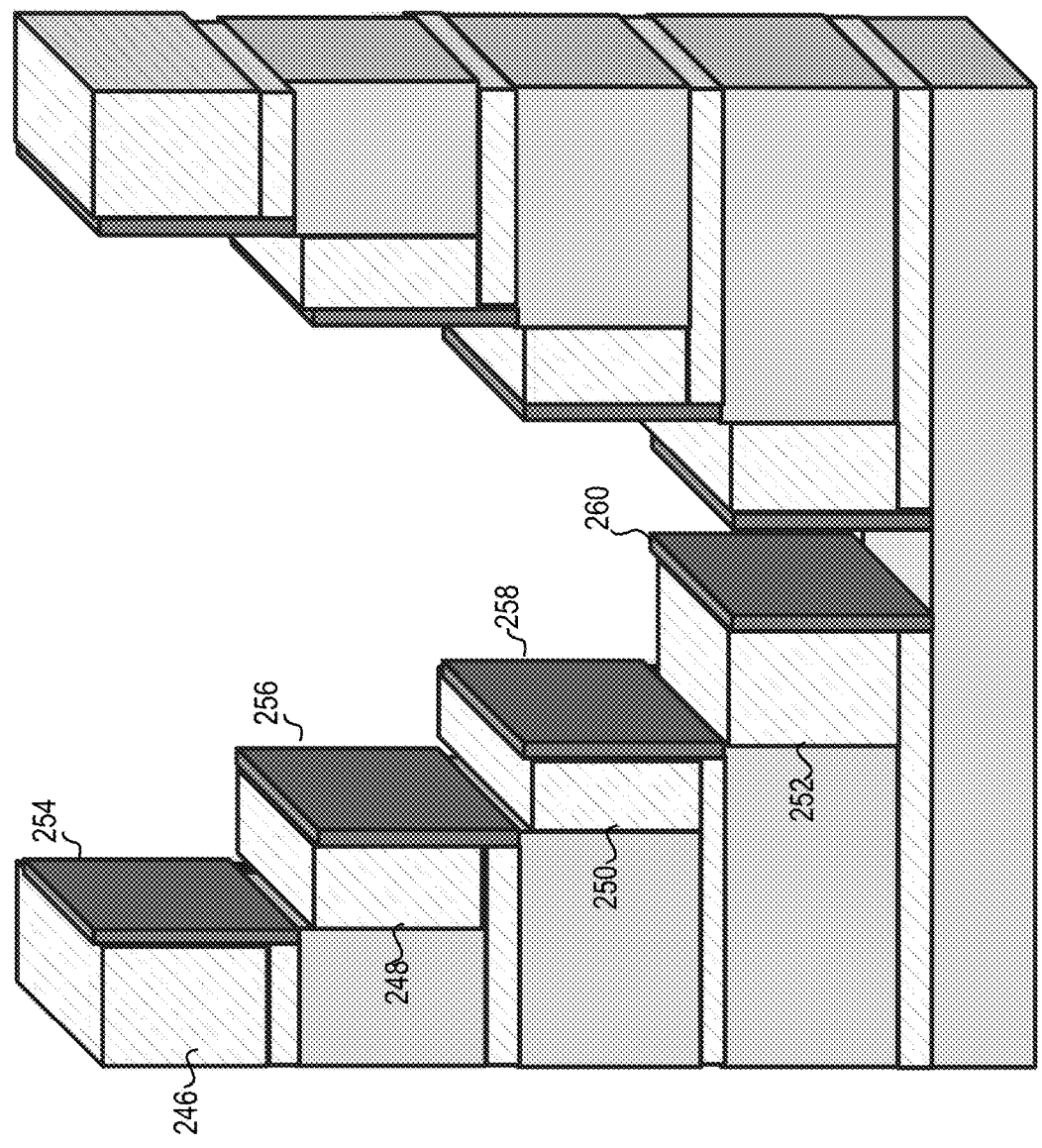
Figure 3I:
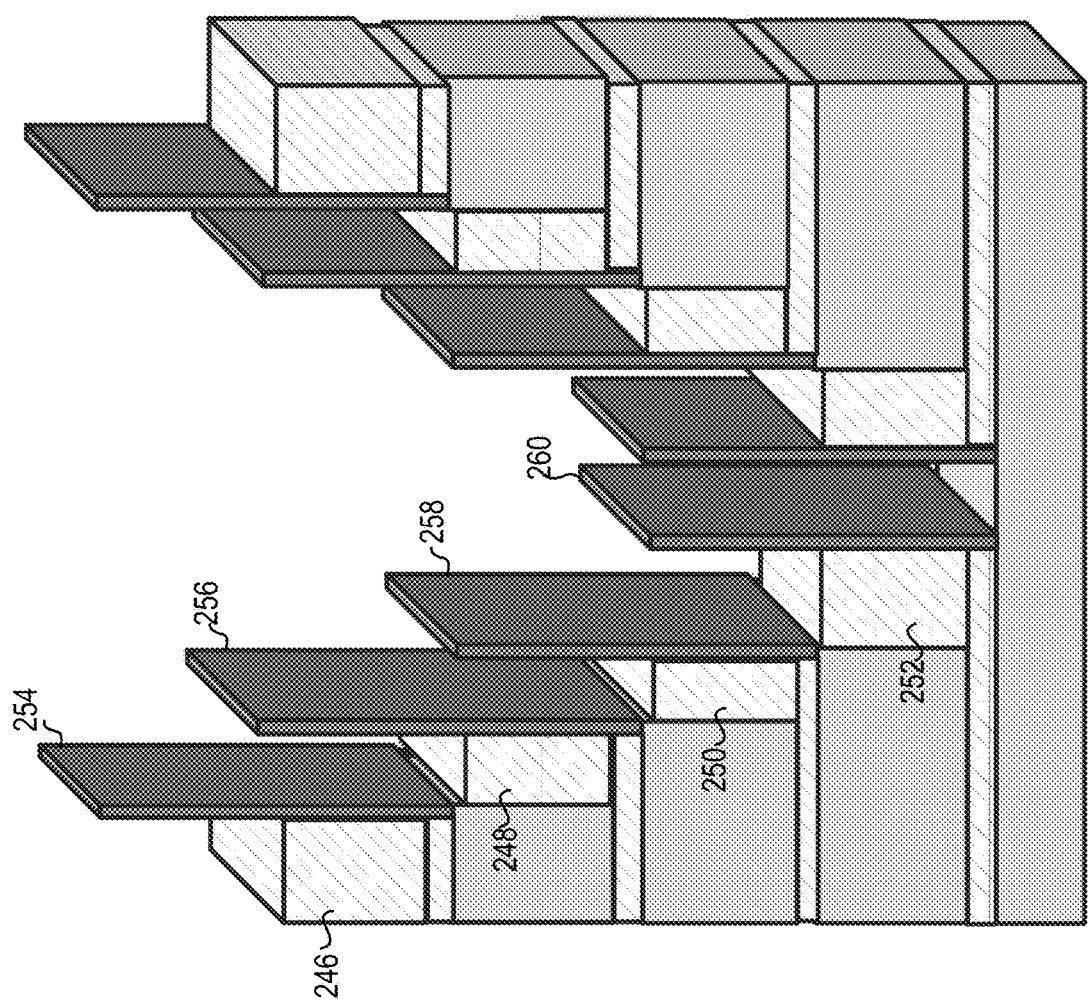
Figure 3J:
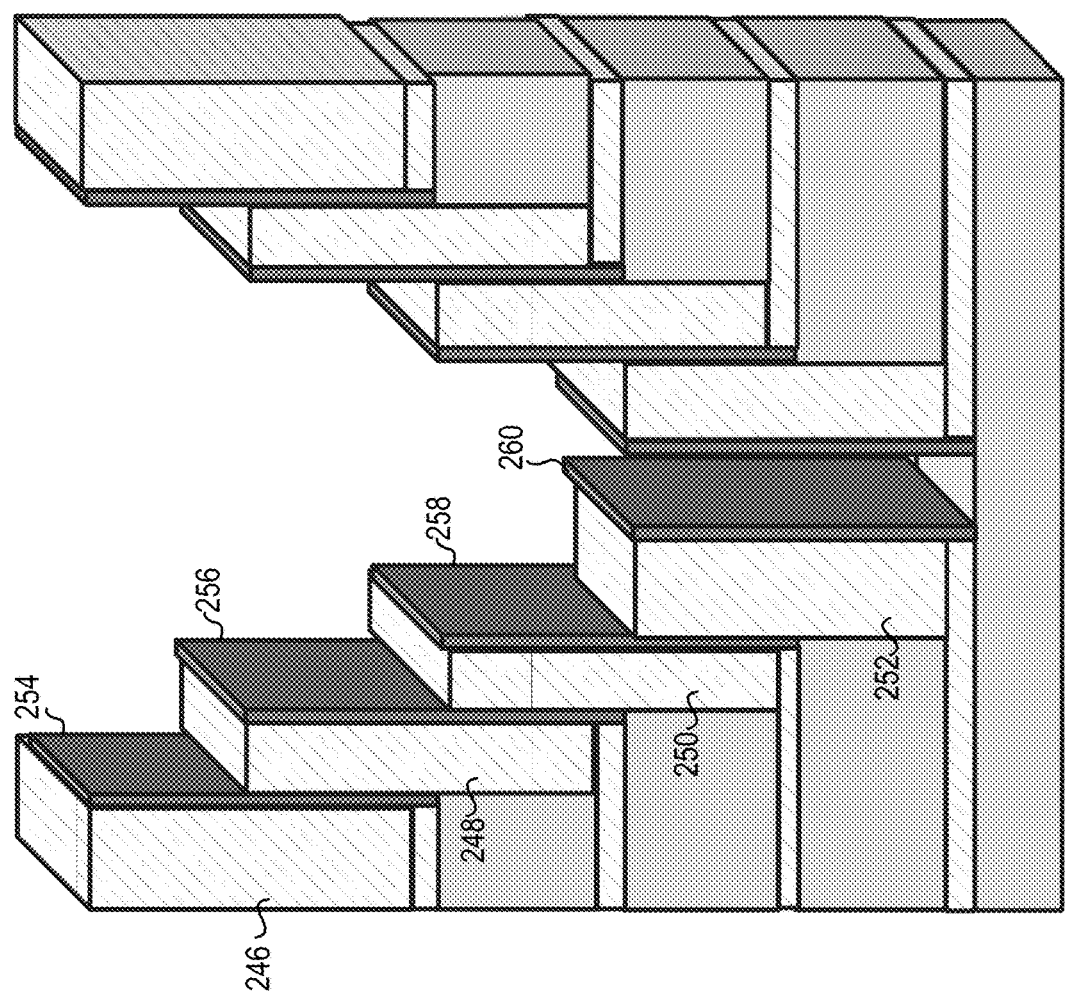
Figure 3K:
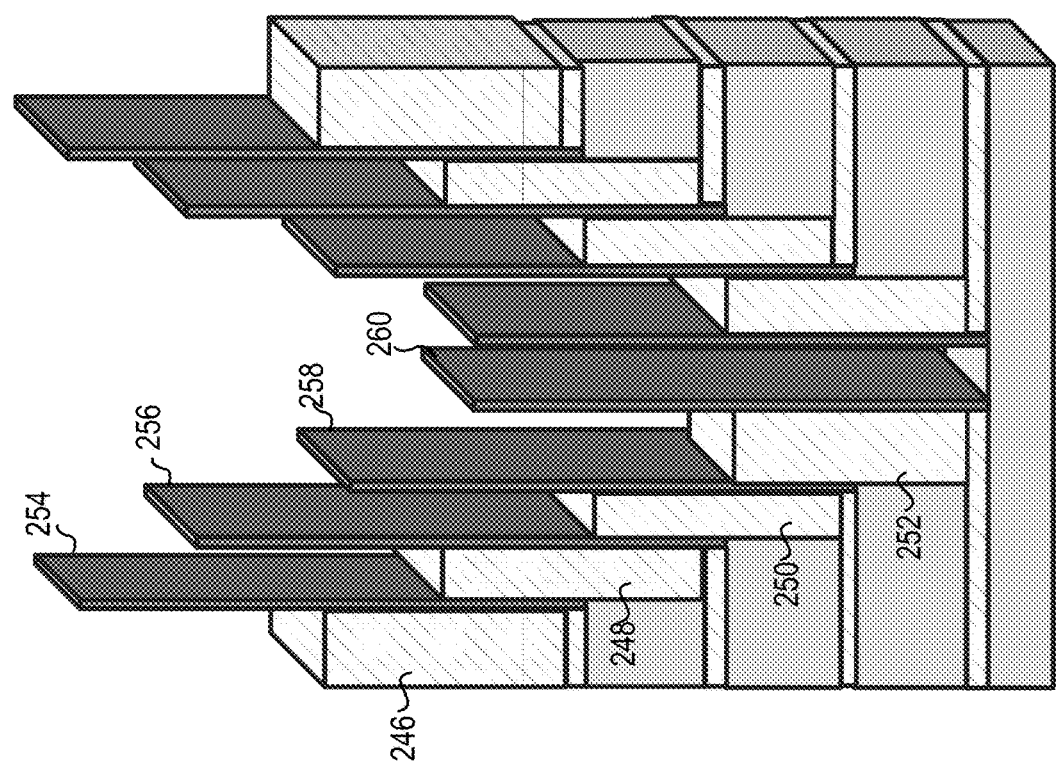
Figure 3L:
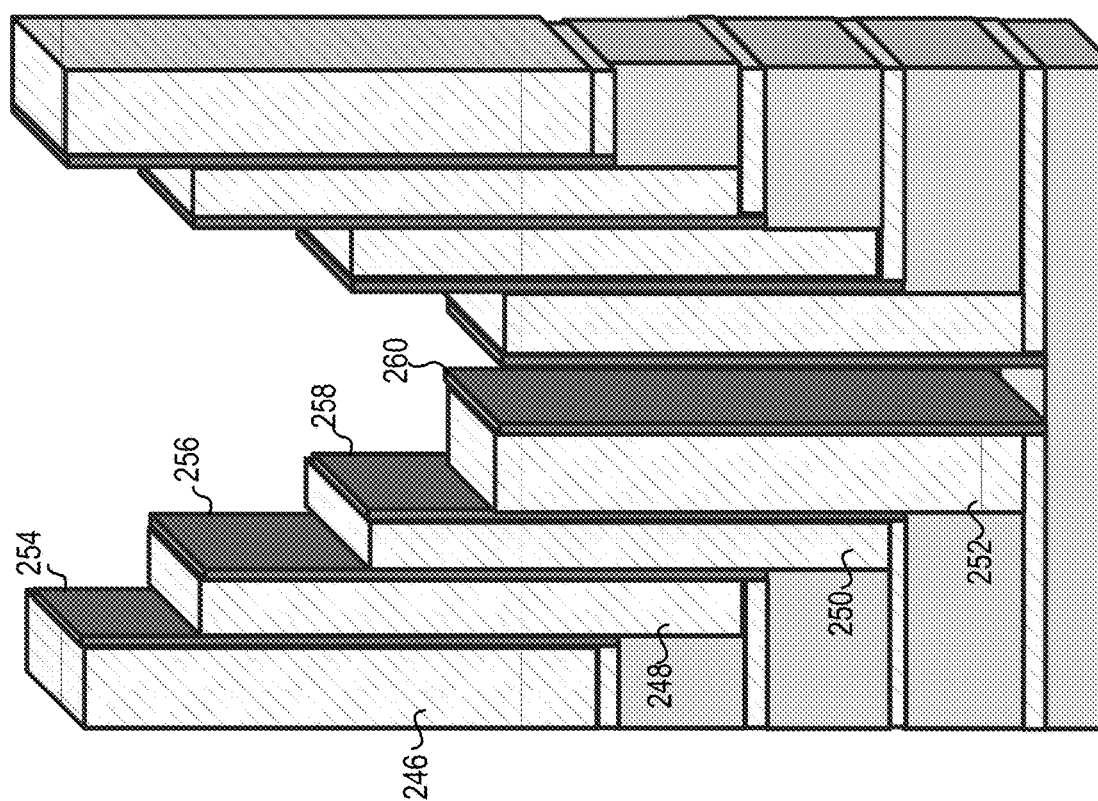

In FIG. 3F, a selective metal-on-metal deposition can be applied to initiate a growth of the plurality of conductive layers 246-252 on the exposed metal regions. The conductive layers 246-252 can be formed selectively over the uncovered portions 226a-232a of the local interconnects 226-232 and positioned along the first sidewalls 254a-260a of the isolation caps 254-260. In some embodiments, the conductive layers can be arranged between the sidewalls of the dielectric layers and the first sidewalls of the isolation caps. For example, the conductive layer 248 is positioned between the sidewall 236a of the dielectric layer 236 and the first sidewall 256a of the isolation cap 256. In some embodiments, the conductive layers can be in direct contact with a source/drain region. For example, the conductive layer 246 is in direct contact with the source region 218 (not shown in FIG. 3F). The conductive layers can be made of tungsten (W), cobalt (Co), ruthenium (Ru), nickel (Ni), or other suitable conductive materials. Any suitable film deposition technique can be applied to form the insulation cap. For example, the film deposition technique can include chemical vapor deposition (CVD), physical vapor deposition (PVD), diffusion, and atomic layer deposition (ALD).

Figure 3M:

In FIGS. 3G-3L, processing of the substrate is continued by alternating cycles of selective deposition of insulator-on-insulator (e.g., the isolation caps 254-260) and metal-on-metal (e.g., the conductive layers 246-252). This alternating deposition and growth maintains electrical isolation between contacts (e.g., the conductive layers 246-252) as well as from neighboring local interconnect structures (e.g., the local interconnects 226-232). The isolation caps and the conductive layers can be alternatively grown so as to reach a predetermined height. When the predetermined height is met, a surface planarization process, such as a chemical mechanical polishing (CMP), can be applied to flatten top surfaces of the insulation caps and top surfaces of the conductive layers. FIG. 3M shows a plurality of final self-aligned vertical contacts that are formed after the CMP process. Thus, by alternating between growing dielectric material only on the insulation caps and conductive material only on the conductive layers, self-aligned vertical contacts can be formed. As shown in FIG. 3M, the self-aligned vertical contacts formed in a transistor stack 600 can have similar configurations to the self-aligned vertical contacts formed in the transistor stack 300 shown in FIG. 1B. Growing these vertical interconnect features in this manner, using selective deposition to differentiate growth of insulator (e.g., insulation caps) and conductor (e.g., conductive layers), results in self-aligned contact features that are insensitive to yield loss from patterning variation. This self-alignment enables increased dimensional scaling.

In the present disclosure, one embodiment includes a method of microfabrication, such as on a semiconductor wafer. A step-shaped stack of layers of transistor devices is formed on a substrate in which a local interconnect structure of a given layer extends horizontally beyond an edge of an overlying layer. This can repeat for each layer so that a stair-cased or stair step type of geometric structure is formed. A dielectric layer is formed between each layer of transistor devices, and a conductive layer (e.g., the local interconnect) is formed on a top surface of each layer of transistor devices. During fabrication, each layer can first be formed as a continuous layer, and then various etch and patterning techniques can be used to form a pyramid or stair-cased structure. Each layer then has a conductive top surface and an insulator bottom surface, and a portion of each layer essentially protrudes from an overlaying layer or layer above.

A first insulator material (e.g., the insulation cap) is selectively formed or deposited on uncovered sidewalls of local interconnect structures or layers. Then, a first conductive material (e.g., the conductive layer) is selectively formed on or grown on uncovered horizontal surfaces of the local interconnect structures. Accordingly, horizontal surfaces of the local interconnect structures or layer steps can have a conductive layer. After these initial two material formations, material is then grown upwardly by alternating material formation. Additional first insulator material is formed on uncovered surfaces of the first insulator material in a vertical direction. And then additional first conductive material (or different conductive material) is formed on uncovered first conductive material in a vertical direction until reaching a predetermined vertical height of the first insulator material and the first conductive material. Note that the resulting structures of vertical conductive structures can have relative heights mirroring the stair-cased structures. The substrate can then be planarized such as by chemical mechanical polishing to yield a planar surface.

Figure 4:
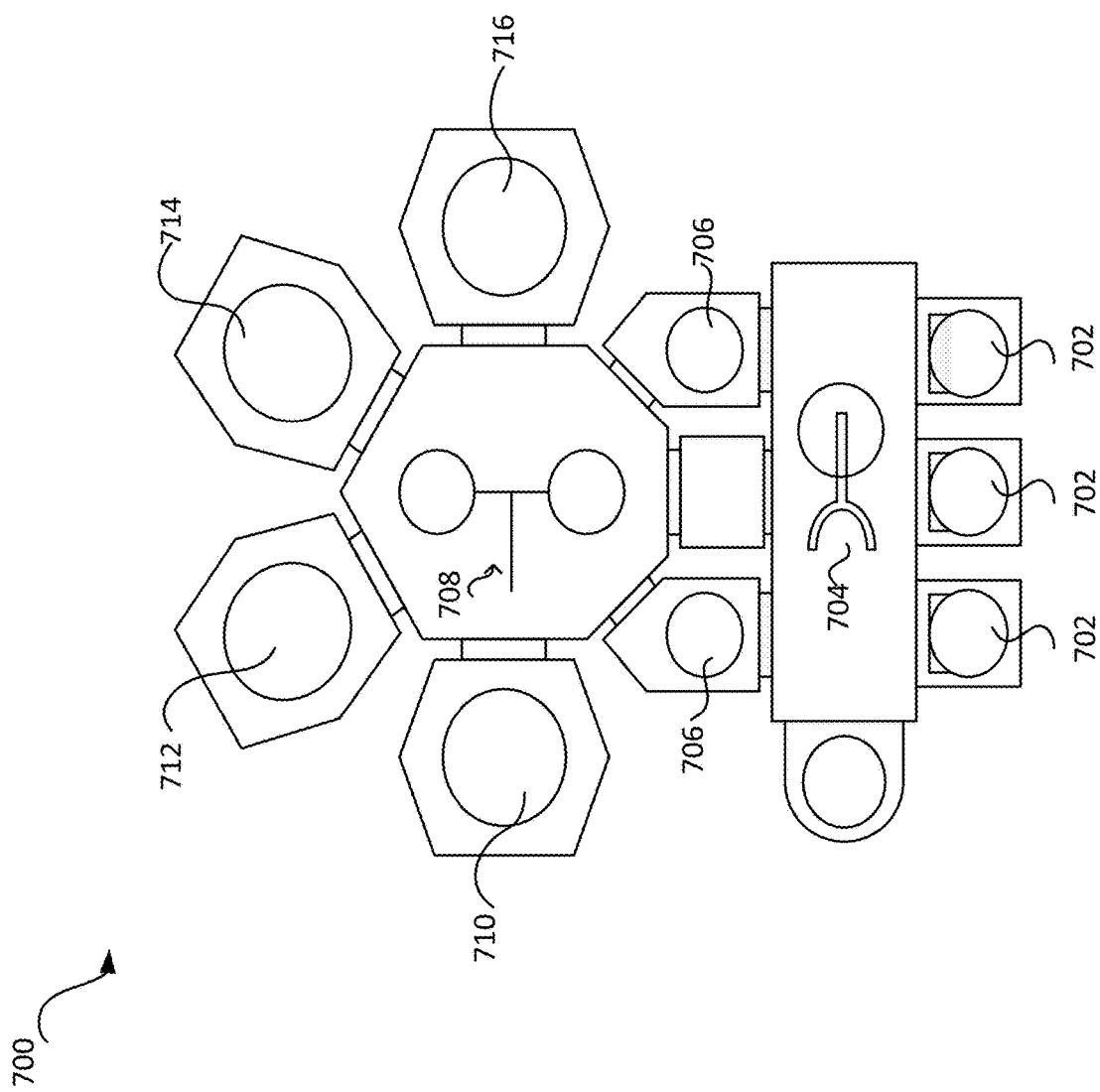
FIG. 4 is a schematic view of a first semiconductor equipment configured to form self-aligned contacts, in accordance with some embodiments.
Figure 5:
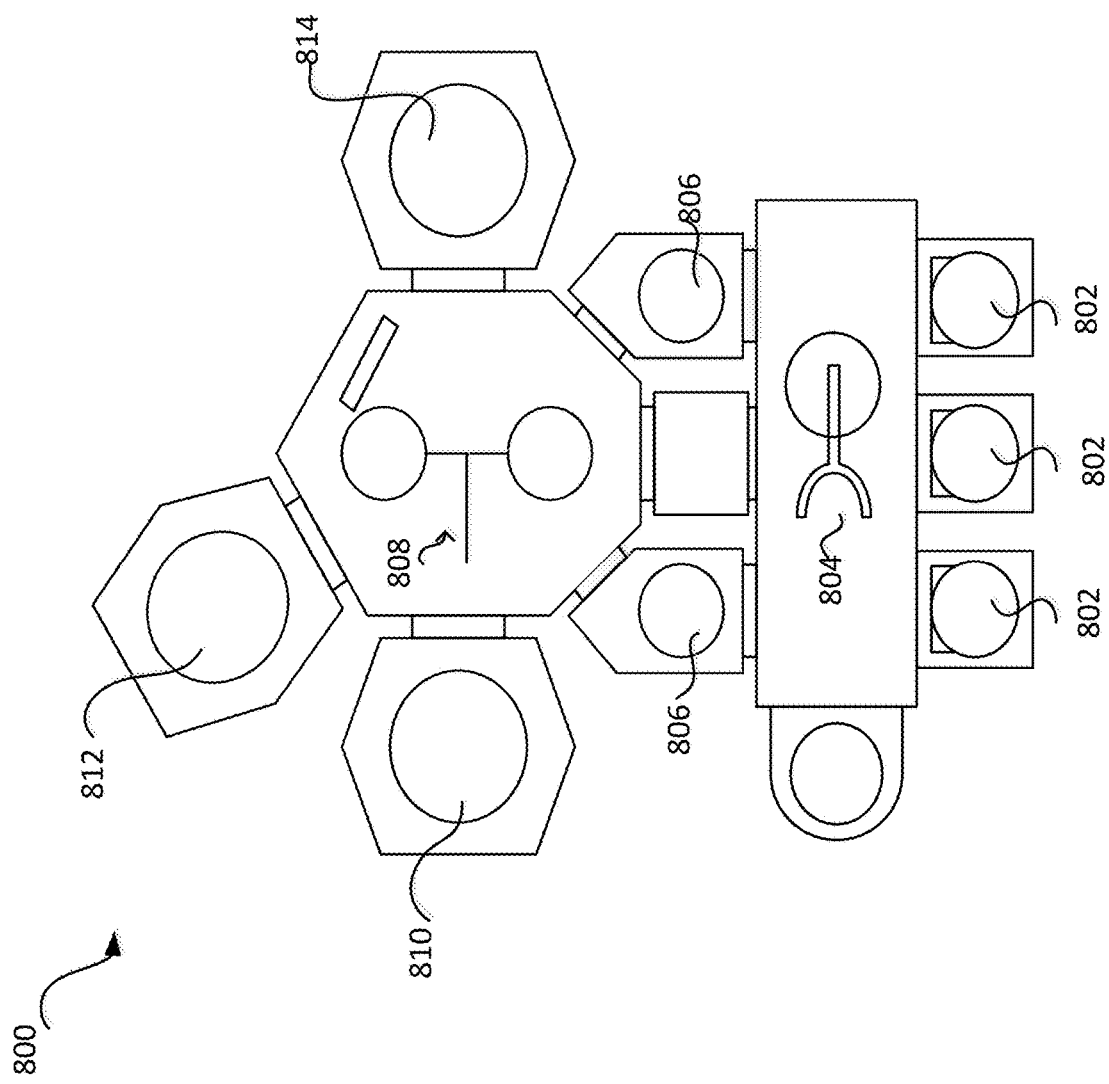
FIG. 5 is a schematic view of a second semiconductor equipment configured to form self-aligned contacts, in accordance with some embodiments.

FIGS. 4 and 5 provide semiconductor equipment configured to deposit metals and metal-oxide insulators that can be selectively deposited to practice methods herein.

FIG. 4 is schematic view of a first semiconductor equipment 700 configured to deposit metals and dielectric materials (e.g., metal oxides) so as to selectively form the conductive layers or the insulation caps respectively. As shown in FIG. 4, the equipment 700 can provide a chemical vapor deposition (CVD) process. The equipment 700 can include a plurality of wafer load ports 702 configured to receive wafers, and a wafer handler 704 configured to transport the wafers from the wafer load ports to the load locks 706. The load locks 706 function as secondary vacuum chambers to house wafers and further transfer the wafers to processing chambers. The equipment 700 also includes a plurality of processing chambers 710-716 and a wafer transfer mechanism 708 configured to transfer the wafers between the processing chambers.

The equipment 700 can include a first processing chamber 710 configured to deposit the metal, such as Ru, Co, W, Ni, or other suitable metals, to form the conductive layers. The equipment 700 can have a treatment chamber 712 configured to remove surface oxide on the conductive structures through a plasma process or a $H_2O$ vapor process. The treatment chamber 712 can also provide an annealing process, and a deposition of a self-alignment monolayer (SAM) that helps selective growths of the conductive layer, or the dielectric layer. The equipment 700 further includes a second deposition chamber 714 configured to form a first dielectric material, such as SiO, and a third deposition chamber 716 configured to form a second dielectric material, such as metal oxide. The metal oxide can include $Al_2O_3$, $HfO_2$, $ZrO_2$, $TiO_2$, or other suitable metal oxides.

An exemplary deposition process based on the equipment 700 to form the ruthenium can involve in introducing Ru CVD precursors into the first processing chamber 710 and a processing temperature between 400° C. and 600° C. The Ru CVD precursors include $Ru(acac)_3$ (acac also referred to as acetylacetinate), $Ru(EtCp)_2$ (EtCp also referred to as ethylcyclopentadienyl), $Ru_3(CO)_{12}$, or the like.

FIG. 5 is a schematic view of a second semiconductor equipment 800 configured to form the insulation caps or the conductive layers. As shown in FIG. 5, the semiconductor equipment 800 can include a plurality of wafer load ports 802, a wafer handler 804, one or more load locks 806, a plurality of processing chambers 810-814, and a wafer transfer mechanism 808. The processing chambers include a first processing chamber 810 configured to deposit metal, such as layer, such as Ru, Co, W, Ni, or other suitable metals, to form the conductive layers. The equipment 800 can have a treatment chamber 812 that has a similar function as the treatment chamber 712 mentioned above, and a second processing chamber 814. Comparing to the equipment 700, the second processing chamber 814 can produce a first dielectric material (e.g., SiO) and second dielectric material (e.g., metal oxide) in sequence. For example, second processing chamber 814 can form the first dielectric material firstly and the second dielectric material secondly. The second processing chamber 814 can also form the second dielectric material firstly and the first dielectric material secondly according to the manufacturing requirements.

The various embodiments described herein offer several advantages over related examples. For example, techniques herein provide a self-aligned process flow to form contacts on stair-cased devices at dimensions which are decoupled from lithography resolution or overlay control. Accordingly, vertical connections on stair-cased devices in 3D integrated logic or memory are provided using monolithically integrated stacks of transistors.

In the preceding description, specific details have been set forth, such as a particular geometry of a processing system and descriptions of various components and processes used therein. It should be understood, however, that techniques herein may be practiced in other embodiments that depart from these specific details, and that such details are for purposes of explanation and not limitation. Embodiments disclosed herein have been described with reference to the accompanying drawings. Similarly, for purposes of explanation, specific numbers, materials, and configurations have been set forth in order to provide a thorough understanding. Nevertheless, embodiments may be practiced without such specific details. Components having substantially the same functional constructions are denoted by like reference characters, and thus any redundant descriptions may be omitted.

Various techniques have been described as multiple discrete operations to assist in understanding the various embodiments. The order of description should not be construed as to imply that these operations are necessarily order dependent. Indeed, these operations need not be performed in the order of presentation. Operations described may be performed in a different order than the described embodiment. Various additional operations may be performed and/or described operations may be omitted in additional embodiments.

"Substrate" or "target substrate" as used herein generically refers to an object being processed in accordance with the invention. The substrate may include any material portion or structure of a device, particularly a semiconductor or other electronics device, and may, for example, be a base substrate structure, such as a semiconductor wafer, reticle, or a layer on or overlying a base substrate structure such as a thin film. Thus, substrate is not limited to any particular base structure, underlying layer or overlying layer, patterned or un-patterned, but rather, is contemplated to include any such layer or base structure, and any combination of layers and/or base structures. The description may reference particular types of substrates, but this is for illustrative purposes only.

Those skilled in the art will also understand that there can be many variations made to the operations of the techniques explained above while still achieving the same objectives of the invention. Such variations are intended to be covered by the scope of this disclosure. As such, the foregoing descriptions of embodiments of the invention are not intended to be limiting. Rather, any limitations to embodiments of the invention are presented in the following claims.

What is claimed is:

1. A semiconductor device, comprising:
    dielectric layers stacked over a substrate and extending laterally along a top surface of the substrate, sidewalls of the dielectric layers having a staircase configuration;
    local interconnects alternately stacked over the dielectric layers and extending laterally along the top surface of the substrate, sidewalls of local interconnects having a staircase configuration, wherein each of the local interconnects is positioned over a corresponding dielectric layer and extends along a top surface of the corresponding dielectric layer so that the local interconnects are spaced apart from each other by the dielectric layers, and have uncovered portions by the dielectric layers;
    conductive layers selectively positioned on the uncovered portions of the local interconnects and further extending vertically from the uncovered portions of the local interconnects, sidewalls of the conductive layers and the sidewalls of the local interconnects being coplanar; and
    isolation caps extending from the dielectric layers, the isolation caps further being positioned along the sidewalls of the conductive layers and the local interconnects so as to separate the conductive layers from one another, wherein a sidewall of each of the dielectric layers protrudes beyond a sidewall of an overlying local interconnect from the local interconnects so as to form a gap, a corresponding isolation cap from the isolation caps being positioned in the gap.

2. The semiconductor device of claim 1, further comprising:

transistor pairs that are stacked over the substrate, each of the transistor pairs including a n-type transistor and a p-type transistor that are stacked over one another, wherein:

the n-type transistor has a source region and a drain region that are positioned at two ends of a n-type channel region of the n-type transistor, each of the source region and drain region of the n-type transistor being coupled to a respective local interconnect from the local interconnects, the n-type channel region being surrounded by a n-type gate structure; and the p-type transistor has a source region and a drain region that are positioned at two ends of a p-type channel region of the p-type transistor, each of the source region and drain region of the p-type transistor being coupled to a respective local interconnect from the local interconnects, the p-type channel region being surrounded by a p-type gate structure.

3. The semiconductor device of claim 2, further comprising:

gate electrodes that are stacked over the substrate with a staircase configuration, each of the gate electrodes being electrically coupled to a corresponding gate structure from the transistor pairs.

4. The semiconductor device of claim 3, wherein each of the local interconnects is positioned at one of two sides of a respective gate electrode from the gate electrodes.

5. The semiconductor device of claim 1, wherein top surfaces of the isolation caps and top surfaces of the conductive layers are coplanar.

6. The semiconductor device of claim 1, wherein each of the isolation caps has a first sidewall and a second sidewall.

7. The semiconductor device of claim 6, wherein the first sidewall of each of the isolation caps is in direct contact with a corresponding local interconnect from the local interconnects.

8. The semiconductor device of claim 6, wherein the second sidewall of each of the isolation caps is level with a sidewall of an underlying dielectric layer from the dielectric layers.

9. The semiconductor device of claim 6, wherein:

a first local interconnect of the local interconnects and a first isolation cap of the isolation caps are positioned over a first dielectric layer of the dielectric layers, a first conductive layer of the conductive layers is positioned over the first local interconnect and in contact with the first isolation cap, the sidewall of the first local interconnect and the sidewall of the first conductive layer are coplanar, the first sidewall of the first isolation cap is in contact with the sidewalls of the first local interconnect and the first conductive layer, and the second sidewall of the first isolation cap is level with the sidewall of the first dielectric layer.

10. A method for forming a semiconductor device, comprising:

forming transistor pairs that are stacked over a substrate, each of the transistor pairs including a n-type transistor and a p-type transistor that are stacked over one another;

forming dielectric layers and local interconnects over the substrate, the dielectric layers being stacked over the substrate and extending laterally along a top surface of the substrate, the local interconnects being stacked alternately over the dielectric layers so that the local interconnects are spaced apart from one another by the dielectric layers, sidewalls of the dielectric layers and sidewalls of the local interconnects being coplanar and having a staircase configuration so that a sidewall of each of the local interconnects is level with a sidewall of an overlying dielectric layer from the dielectric layers, each of the local interconnects being electrically coupled to one of a corresponding source region and a corresponding drain region from the transistor pairs;

forming isolation caps that are selectively positioned along sidewalls of the local interconnects;

removing portions of the dielectric layers along sidewalls of the isolation caps to form uncovered portions of the local interconnects; and forming conductive layers over the uncovered portions of the local interconnects so that the conductive layers are spaced apart from one another by the isolation caps.

11. The method of claim 10, before the removing the portions of the dielectric layers, further comprising:

selectively growing the isolation caps vertically along the sidewalls of the local interconnects and the sidewalls of the dielectric layers.

12. The method of claim 10, after the forming the conductive layers, further comprising:

alternatively growing the isolation caps and the conductive layers so as to reach a predetermined height.

13. The method of claim 12, further comprising:

performing a surface planarization process so that top surfaces of the isolation caps and top surfaces of the conductive layers are coplanar.

14. The method of claim 10, wherein the isolation caps comprises at least one of $Al_2O_3$, $HfO_2$, $ZrO_2$, $TiO_2$, or $SiO_2$.

15. The method of claim 10, wherein the conductive layers comprises at least one of Ru, Co, W, Ni, or Cu.

16. The method of claim 10, wherein forming the transistor pairs further comprises:

forming gate electrodes that are stacked over the substrate with a staircase configuration, each of gate electrodes being electrically coupled to a corresponding gate structure from the transistor pairs.

17. A semiconductor device, comprising:

transistor pairs that are stacked over a substrate, each of transistor pairs including a n-type transistor and a p-type transistor that are stacked over one another;

dielectric layers that are stacked over the substrate and extending laterally along a top surface of the substrate, sidewalls of the dielectric layers having a staircase configuration;

local interconnects stacked alternately over the dielectric layers and extending laterally along the top surface of the substrate, sidewalls of the local interconnects having a staircase configuration, wherein each of the local interconnects is electrically coupled to one of a corresponding source region and a corresponding drain region from the transistor pairs, and each of the local interconnects is positioned over a corresponding dielectric layer and extends along a top surface of the corresponding dielectric layer so that the local interconnects are spaced apart from each other by the dielectric layers, and further have uncovered portions by the dielectric layers;

conductive layers positioned on the uncovered portions of the local interconnects and further extending vertically from the uncovered portions of the local interconnects, sidewalls of the conductive layers and the sidewalls of the local interconnects being coplanar; and isolation caps extending from the dielectric layers, the isolation caps further being positioned along the sidewalls of the conductive layers and the sidewalls of the local interconnects so as to separate the conductive layers from one another, wherein a sidewall of each of the dielectric layers protrudes beyond a sidewall of an overlying local interconnect from the local interconnects so as to form a gap, a corresponding isolation cap from the isolation caps being positioned in the gap.

18. The semiconductor device of claim 17, further comprising:

gate electrodes that are stacked over the substrate with a staircase configuration, each of gate electrodes being electrically coupled to a corresponding gate structure from the transistor pairs.

19. The semiconductor device of claim 17, wherein a first sidewall of each of the isolation caps is in direct contact with a corresponding local interconnect from the local interconnects.

20. The semiconductor device of claim 17, wherein a second sidewall of each of the isolation caps is level with a sidewall of an underlying dielectric layer from the dielectric layers.

* * * * *